(12) United States Patent
Tanaka

(10) Patent No.: US 6,326,783 B1
(45) Date of Patent: Dec. 4, 2001

(54) METHOD OF MEASURING AXIALLY SYMMETRIC ELECTROMAGNETIC FIELDS

(75) Inventor: Hitoshi Tanaka, Tokyo (JP)

(73) Assignee: Advantest Corporation, Tokyo (JP)

( * ) Notice: Subject to any disclaimer, the term of this patent is extended or adjusted under 35 U.S.C. 154(b) by 0 days.

(21) Appl. No.: 09/232,745

(22) Filed: Jan. 15, 1999

(30) Foreign Application Priority Data

Mar. 31, 1998 (JP) .................................................. 10-085873

(51) Int. Cl.[7] .................................................. G01R 33/00
(52) U.S. Cl. ...................... 324/263; 324/207.25; 324/260
(58) Field of Search .............................. 324/263, 207.25, 324/260, 144, 250, 261, 207.17; 250/309, 311, 306, 310

(56) References Cited

U.S. PATENT DOCUMENTS

| 4,255,702 | 3/1981 | Tricoles et al. | 324/58 B |
| 4,274,048 | * 6/1981 | Tricoles et al. | 324/58 R |
| 4,968,983 | 11/1990 | Maeda et al. | 343/703 |
| 5,589,773 | 12/1996 | Berger et al. | 324/261 |

FOREIGN PATENT DOCUMENTS

| 1-65465 | 3/1989 | (JP) . |
| 5-26930 | 2/1993 | (JP) . |

\* cited by examiner

Primary Examiner—Jay Patidar

(57) ABSTRACT

Disclosed is a method of measuring axially symmetric magnetic fields. According to this method, an electric field generator or magnetic field generator for generating axially symmetric electric fields or magnetic fields is placed on a rotator. The rotator is used to change a rotational position of the electric field generator or magnetic field generator, that is, a specified sector thereof. Meanwhile, an electric field or magnetic field is measured.

4 Claims, 3 Drawing Sheets

ANGLE

METHOD OF MEASURING AXIALLY SYMMETRIC ELECTROMAGNETIC FIELDS

BACKGROUND OF THE INVENTION

1. Field of the Invention

The present invention relates to an electromagnetic field measuring method for measuring axially symmetric electromagnetic fields generated by an electromagnetic lens, or the like, employed in electron beam exposure units or electron microscopes.

2. Description of the Related Art

Electron microscopes have been widely adopted as a means for observing submicroscopic objects. A scanning type electron microscope (SEM) has been used as a typical electron microscope. The scanning type electron microscope scans a sample with an electron beam that is converged to a very small spot, and detects electrons transmitted or reflected by the sample. The resolution is determined with the size of the spot of the irradiated electron beam.

Moreover, electron beam exposure units have attracted attention because of their capability as lithographic units for exposing submicroscopic patterns including patterns that define semiconductor devices. The electron beam exposure unit exposes, like the scanning type electron microscope, a resist applied to a substrate to an electron beam converged on a very small spot so as to pattern the resist. The electron beam exposure unit is characterized by its ability to offer a higher resolution than the one offered by lithography and to therefore draw finer patterns. The resolution that can be offered by the electron beam exposure unit is determined by the size of the spot of the irradiated electron beam.

In the electron microscope or electron beam exposure unit, for converging or deflecting an electron beam, electric fields or magnetic fields are utilized and an electronic lens or magnetic lens is employed. The magnetic lens produces a magnetic field when current flows into a wire wound coil. The magnetic lens is used as a convergent lens for converging an electronic beam or as a focusing coil for changing a focal point. Almost all the magnetic lenses are intended to generate axially symmetric magnetic fields, and they are manufactured by creating a coil, using a closely wound wire, so that an exactly axially symmetric magnetic field can be generated. Many other apparatuses are employed which generate magnetic fields. For example, there is a magnetic resonance imaging computed tomography modality utilizing nuclear magnetic resonance. Almost all the apparatuses generate an exactly axially symmetric magnetic field. Moreover, an electrostatic lens for generating an axially symmetric electric field is employed in television sets. Hereinafter, a magnetic field generator for generating axially symmetric magnetic fields will be described as an example. The same will apply to an electric field generator for generating an axially symmetric electric field. The present invention can be adapted to the electric field generator.

For manufacturing or developing magnetic field generators for generating axially symmetric magnetic fields, it is necessary to measure magnetic fields generated by the generators to see if they have the desired strengths. According to a magnetic field measuring method of a prior art, a three-dimensional moving mechanism is used to move a measuring probe of a gaussmeter. A range within which the measuring probe can be moved is limited by the three-dimensional moving mechanism. There is a problem in that this kind of three-dimensional moving mechanism is expensive. In particular, for measuring magnetic fields induced on the whole circumference of a magnetic field generator, a three-dimensional moving mechanism having an arm-shaped movable carriage must be employed. This kind of three-dimensional moving mechanism is very large and quite expensive.

Moreover, for improving precision in measurement, it is necessary to improve the accuracy of a position to which the measuring probe is moved. For this purpose, a high-precision three-dimensional moving mechanism must be employed. This also results in making the three-dimensional moving mechanism expensive.

Furthermore, when measurement data acquired by moving the measuring probe is processed, an axis of symmetry of a magnetic field is calculated from the measurement data. The number of operations needed for this processing is so large that it is hard to identify the axis of symmetry precisely.

Moreover, when the magnetic field generator is incorporated in the electron beam exposure unit, the magnetic field generator is positioned in reference to the contour thereof, or in other words, in reference to a mechanical axis of symmetry. A positional deviation between the mechanical axis of symmetry of the magnetic field generator and the axis of symmetry of a magnetic field is measured. The magnetic field generator must then be incorporated after the position thereof is corrected to compensate for the positional deviation. However, there is a problem in that measuring the positional deviation between the mechanical axis of symmetry and the axis of symmetry of a magnetic field is difficult and expensive work. This is because a measuring unit similar to a three-dimensional measuring instrument must be used to measure the magnetic field generator and the position of the measuring probe.

As described above, the measuring method of the prior art for measuring axially symmetric magnetic fields is difficult and expensive work.

SUMMARY OF THE INVENTION

An object of the present invention is to realize a measuring method making it possible to measure axially symmetric magnetic fields with high precision and low cost.

For accomplishing the above object, according to an electromagnetic field measuring method of the present invention, an electric field generator or magnetic field generator for generating an axially symmetric electric field or magnetic field is placed on a rotator.

Specifically, the electromagnetic field measuring method of the present invention is an electromagnetic field measuring method for measuring an axially symmetric electric field or magnetic field generated by an electric field generator or magnetic field generator for generating the axially symmetric electric field or magnetic field. The electromagnetic field measuring method comprises a step of placing the electric field generator or magnetic field generator on a rotator, and a step of measuring an electric field or magnetic field by changing a rotational position of the electric field generator or magnetic field generator using the rotator. Herein, the rotational position means a specified sector of the electric field generator or magnetic field generator.

At the step of placing the electric field generator or magnetic field generator on the rotator, preferably, the electric field generator or magnetic field generator is placed on the rotator so that the axis of the axially symmetric electric field or magnetic field will be aligned with an axis of rotation.

For aligning the axis of the electric field or magnetic field with the axis of rotation, preferably, a two-dimensional moving unit is included for moving the electric field generator or magnetic field generator placed on the rotator relative to the axis of rotation.

Assume that the electric field generator or magnetic field generator has a rotationally symmetric shape. For generating electric fields or magnetic fields that are symmetric with respect to the axis of symmetry of the shape, a roundness measuring instrument or the like is used to position the electric field generator or magnetic field generator. At this time, the electric field generator or magnetic field generator is positioned so that the axis of symmetry of the shape thereof will be aligned with the axis of rotation. Consequently, the axes of the electric fields or magnetic fields align with the axis of rotation.

Another method may be adopted, wherein the position of the electric field generator or magnetic field generator is adjusted relative to the axis of rotation. In this case, after the electric field generator or magnetic field generator is placed on the rotator, even when a rotational position of the electric field generator or magnetic field generator, that is, a specified sector thereof is changed, an electric field or magnetic field induced at any position must not change in strength.

According to the present invention, a rotational position of an electric field generator or magnetic field generator, that is, a specified sector thereof can be changed. If a measuring probe can move on a plane containing an axis of rotation, the measuring probe can measure the electric field generator or magnetic field generator substantially in the whole space. A moving mechanism for moving the measuring probe may therefore be a two-dimensional moving mechanism. The two-dimensional moving mechanism can be realized at lower cost and more compactly than a three-dimensional moving mechanism. Besides, the two-dimensional moving mechanism can move with improved precision.

Moreover, since the electric field generator or magnetic field generator is placed on a rotator, the misalignment of the axis of symmetry of the shape of the generator from the axis of rotation can be measured readily.

BRIEF DESCRIPTION OF THE DRAWINGS

The present invention will be more clearly understood from the description as set below with reference to the accompanying drawings, wherein.

DESCRIPTION OF THE PREFERRED EMBODIMENTS

Before proceeding to the detailed description of the preferred embodiments, a prior art method of measuring an electro-magnetic field will be described with reference to the accompanying drawings for a clearer understanding of the differences between the prior art and the present invention.

Figure 1:
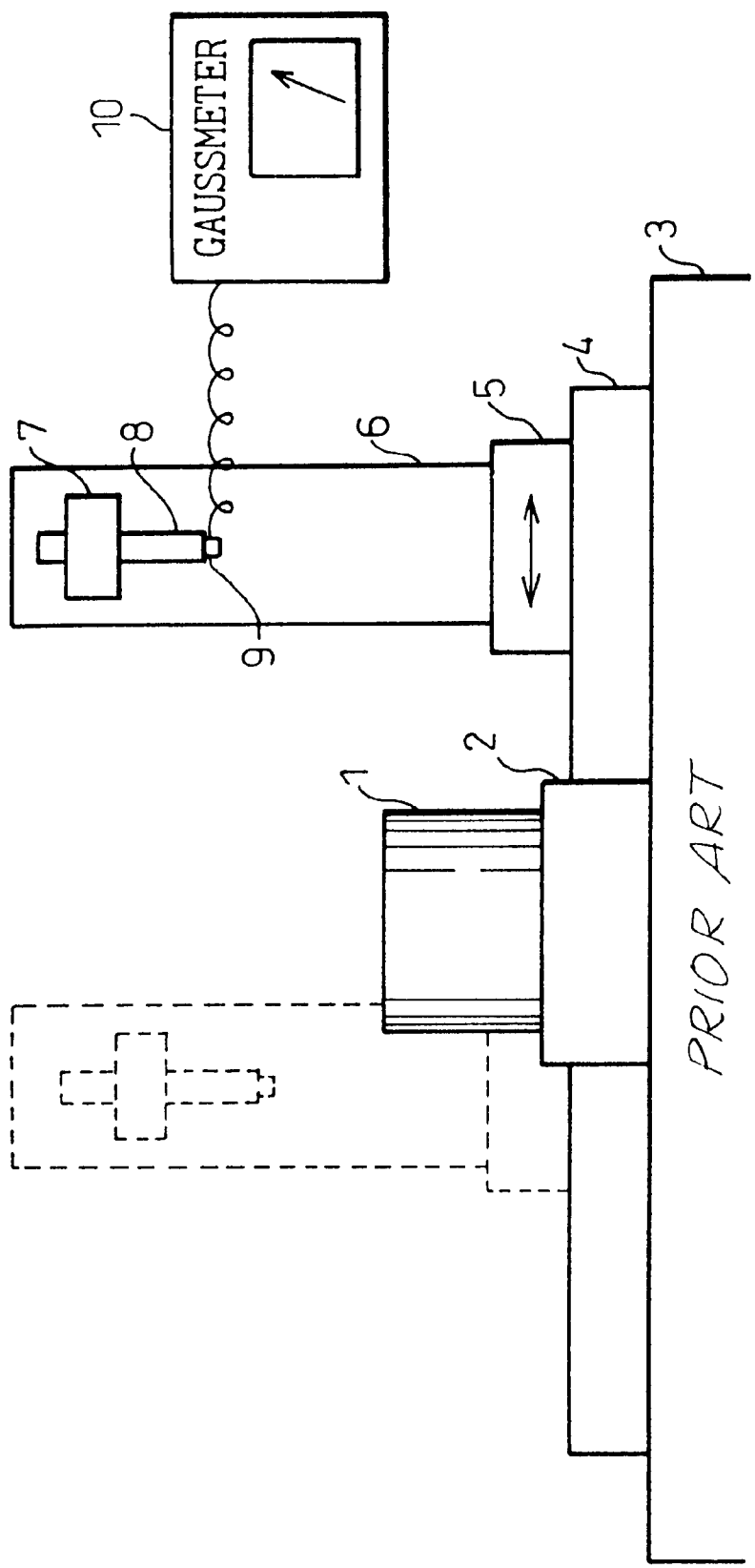
FIG. 1 is a diagram for explaining a prior art for measuring axially symmetric magnetic fields.

FIG. 1 is a diagram illustrating a magnetic field measuring method of a prior art. As shown in FIG. 1, a magnetic field generator 1 for generating axially symmetric magnetic fields is placed on a platform 2 located on a measuring station (base made of marble or the like) 3. Located on the measuring station 3 is a three-dimensional moving mechanism that moves in three directions X, Y, and Z and consists of components 4 to 7. An X movable table 5 having a Y-direction moving mechanism moves in the X direction on a table 4 having an X-direction moving mechanism and being placed on the measuring station 3. A Y movable table 6 having a Z-direction moving mechanism moves in the Y direction on the X movable table 5. A movable carriage 7 moves in the Z direction on the Y movable table 6. Measuring a magnetic field is achieved using a gaussmeter (magnetometer) 10. A measuring probe 9 of the gaussmeter 10 is fixed to a holding member 8 fitted in the movable carriage 7. For measuring a magnetic field, the measuring probe 9 is moved inside the magnetic field generator 1 and on the circumference thereof by means of the three-dimensional moving mechanism. An output of the gaussmeter 10 is recorded with the measuring probe 9 moved to a position.

In the method of measuring axially symmetric magnetic fields in accordance with the prior art shown in FIG. 1, the measuring probe 9 must be moved to a measurement position. A range within which the measuring probe 9 is movable is limited by the three-dimensional moving mechanism. A three-dimensional moving mechanism permitting a wide moving range is necessary to measure the magnetic field generator 1 over a wide range of the circumference thereof. It is a problem that this kind of three-dimensional moving mechanism is expensive. Moreover, in the three-dimensional moving mechanism shown in FIG. 1, the table 4 having the X-direction moving mechanism is placed by the side of the magnetic field generator 1. This poses a problem in that it is hard to measure a magnetic field induced on a side of the magnetic field generator 1 opposite to the table 4. For solving this problem, for example, a three-dimensional moving mechanism is employed which has the X movable table 5 shaped like an arm. This kind of three-dimensional moving mechanism is large in scale and very expensive.

Moreover, for improving precision in measurement, it is necessary to improve the precision of a position to which the measuring probe 9 is moved. A high-precision three-dimensional moving mechanism must be used to improve the precision. This is also a cause making the three-dimensional moving mechanism expensive.

Furthermore, when measurement data acquired by moving the measuring probe 9 is processed, an axis of symmetry of a magnetic field is calculated from the measurement data. However, the number of operations required for the processing is large. This poses a problem in that it is hard to define the axis of symmetry strictly.

Moreover, when the magnetic field generator 1 is incorporated in an electron beam exposure unit or the like, the magnetic field generator 1 is positioned with reference to the contour thereof, or in other words, the mechanical axis of symmetry thereof. From this viewpoint, it is necessary to measure a positional deviation of the mechanical axis of symmetry of the magnetic field generator 1 from the axis of symmetry of a magnetic field. The position of the magnetic field generator 1 must be corrected to compensate for the deviation and then incorporated. Measuring the positional deviation of the mechanical axis of symmetry from the axis of symmetry of a magnetic field is difficult and expensive work. This is because a measuring unit similar to a three-dimensional measuring instrument must be used to measure the positional relationship of the measuring probe 9 to the contour of the magnetic field generator 1 in the arrangement shown in FIG. 1.

As described above, the method of measuring axially symmetric magnetic fields in accordance with the prior art entails difficult and expensive work.

Figure 2A:
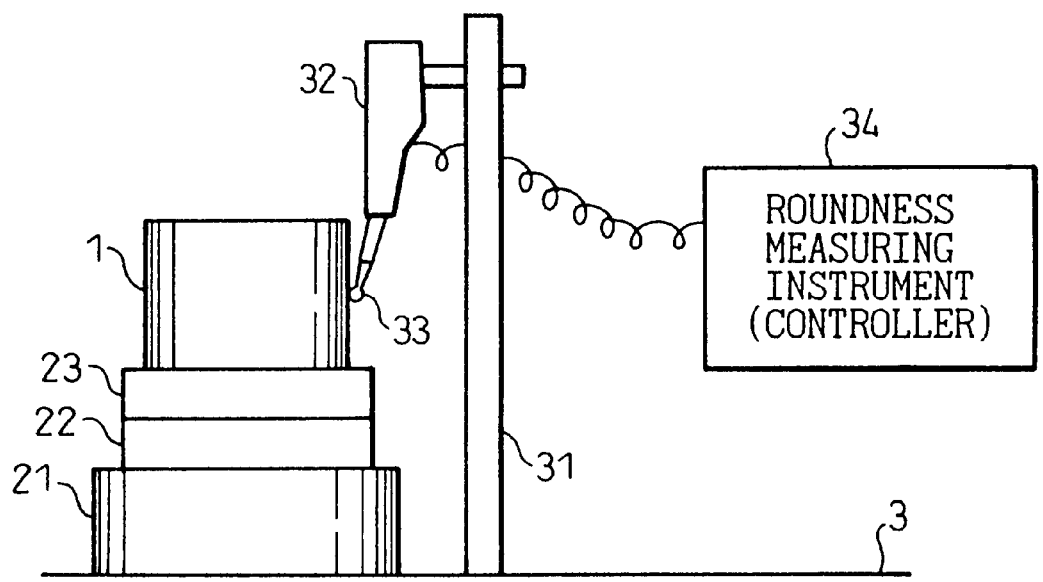
FIG. 2A and FIG. 2B are diagrams for explaining a method of measuring axially symmetric magnetic fields in accordance with the first embodiment of the present invention.
Figure 2B:
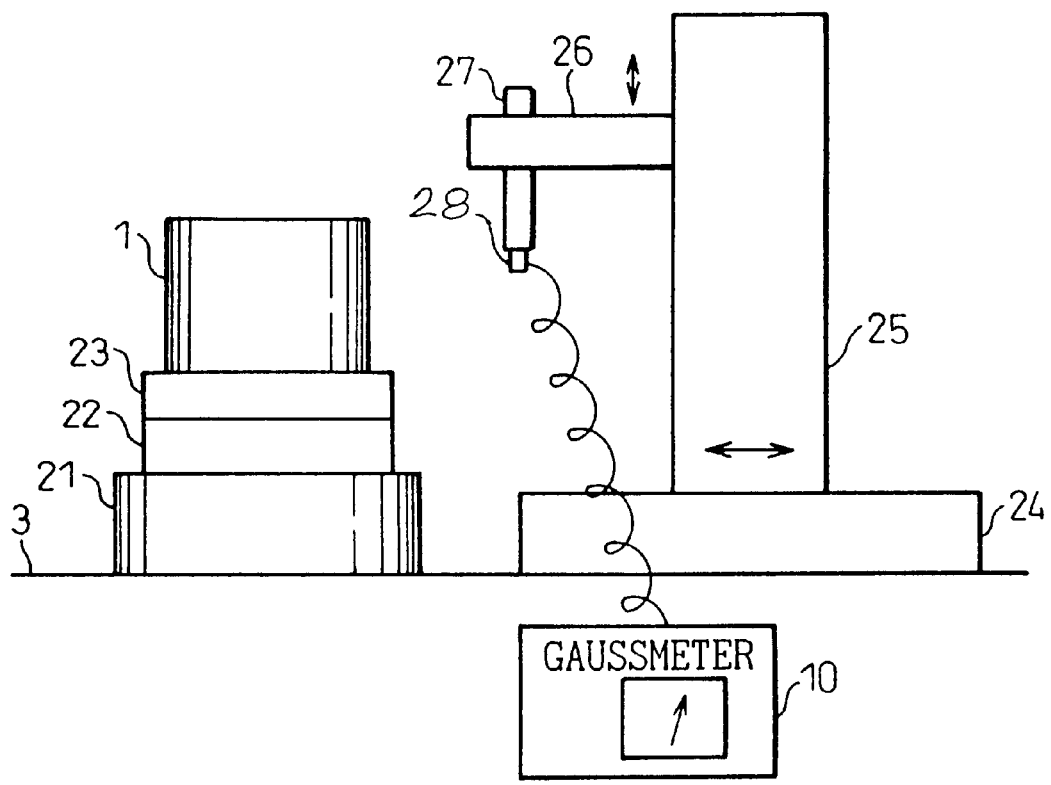

FIG. 2A and FIG. 2B are diagrams for explaining measuring movements to be made according to the magnetic field measuring method of the first embodiment of the present invention. FIG. 2A is a diagram showing the location of the magnetic field generator 1 for generating axially symmetric magnetic fields. FIG. 2B is a diagram showing a state in which a magnetic field is measured.

The magnetic field generator to be measured according to the first embodiment has an axially symmetric contour and generates magnetic fields symmetrically to the axis of the contour. As mentioned above, this kind of magnetic field generator is generally used as a magnetic lens. When the axis of the contour of the magnetic field generator 1 is aligned with the axis of rotation of a rotator, the axes of generated magnetic fields align with the axis of rotation.

As shown in FIG. 2A, a rotator 21 is placed on a measuring station 3. A two-dimensional moving mechanism consisting of components 22 and 23 and moving in two directions X and Y is mounted on the rotator 21. The magnetic field generator 1 that is an object of measurement is placed on the two-dimensional moving mechanism. A mount member 31 is rested on the measuring station 3. A contact type displacement measuring instrument 32 is mounted on the mount member 31. A probe 33 is brought into contact with a side of the magnetic field generator 1. The displacement measuring instrument 32 serves as a measuring unit of a roundness measuring instrument. The displacement measuring instrument 32 causes a differential transformer to generate an electric signal whose level is proportional to the displacement of the probe 33, and outputs the electric signal. The electric signal is input to a controller 34 in the roundness measuring instrument. The two-dimensional moving mechanism consisting of the components 22 and 23 is adjusted so that even when the rotator 21 is rotated in this state, the output of the displacement measuring instrument 32 will not change. Unless the output of the displacement measuring instrument 32 does not change, the axis of the contour of the magnetic field generator 1 remains aligned with the axis of rotation of the rotator. A moving range within which the two-dimensional moving mechanism consisting of the components 22 and 23 moves may be narrow. An inexpensive two-dimensional moving mechanism is therefore usable. Moreover, a change in output of the displacement measuring instrument 32 may be observed directly without use of the controller 34 in the roundness measuring instrument. The use of the controller 34 in the roundness measuring instrument provides a deviation of the axis of the contour from the axis of rotation and the direction of the deviation. It becomes therefore easy to adjust the two-dimensional moving mechanism to achieve axial alignment.

After the axial alignment is completed, the mount member 31, displacement measuring instrument 32, and controller 34 in the roundness measuring instrument are removed as shown in FIG. 2B. A two-dimensional moving mechanism, which moves in two directions X and Z and consists of components 24, 25, and 26, is placed. A measuring probe 28 is mounted in the movable carriage 26 via a mount member 27. An output of the measuring probe 28 is input to a gaussmeter 10. In this state, the work of recording a magnetic field strength obtained by reading the gaussmeter 10 every time the rotator 21 is rotated by a given angle is repeated until the rotator 21 completes one rotation. The same manipulation is repeated while the position of the measuring probe 28 is changed on the XZ plane. Magnetic fields induced over the whole circumference of the magnetic field generator can thus be measured. The positions of the components 24, 25, and 26 constituting the two-dimensional moving mechanism relative to the rotator are measured in advance, so that the positions thereof can be reproduced later.

In the first embodiment, an object of measurement is a magnetic field generator having an axially symmetric contour and generating magnetic fields symmetrically to the axis of the contour. The magnetic field generator is positioned with the contour thereof regarded as a reference. The second embodiment will be described by taking an example of a method in which the magnetic field generator is positioned with the contour thereof not regarded as the reference.

Figure 3A:
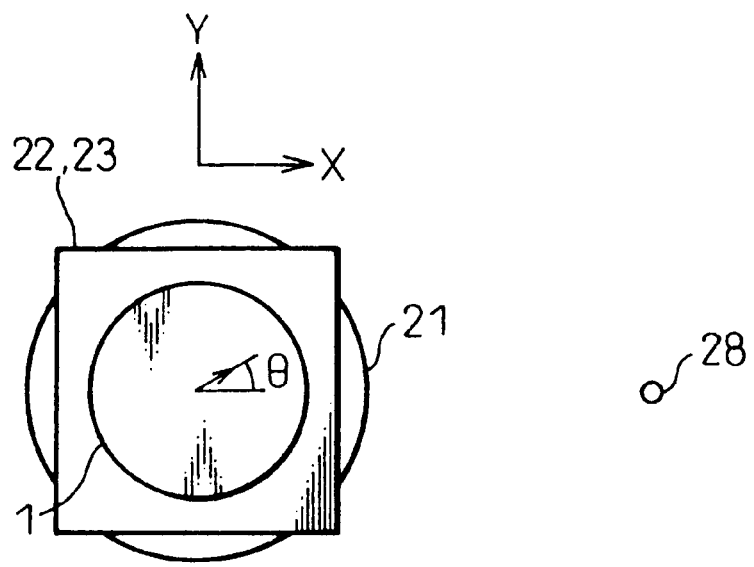
FIG. 3A and FIG. 3B are diagrams for explaining the axis of a magnetic field generated by a magnetic field generator in accordance with the second embodiment of the present invention, and how to adjust the axis of rotation.
Figure 3B:
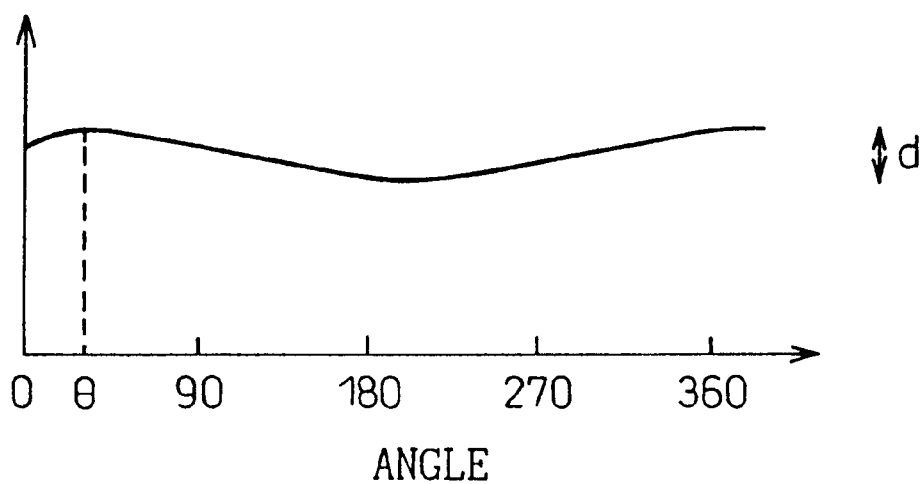

In the second embodiment, the magnetic field generator 1, measuring probe 28, and others are arranged as shown in FIG. 2B. However, the magnetic field generator 1 is not positioned so that the axis of the contour thereof will be aligned with the axis of rotation. FIG. 3A shows the magnetic field generator 1, measuring probe 28, and others that are seen from above. At this time, the axes of magnetic fields generated by the magnetic field generator shall be deviated from the axis of rotation in a direction that is angled by θ relative to the X axis. When the rotator is rotated in this state, a magnetic field strength obtained by reading the gaussmeter 10 changes as shown in FIG. 3B. Specifically, assuming that the X axis lies at the level of zero degrees, the magnetic field strength becomes a maximum at the angle of θ and becomes a minimum at an angle of θ+180°. The amplitude of the change is affected by the magnitude of the deviation of the axes of magnetic fields. The two-dimensional moving mechanism consisting of the components 22 and 23 is therefore moved by a length proportional to the amplitude in a direction of −θ. The rotator is rotated again. If the output of the gaussmeter 10 does not change, it means that the axes of magnetic fields are aligned with the axis of rotation. In this state, the same measuring movements as those made in the first embodiment are carried out. A deviation of the axis of the contour of the magnetic field generator 1 from the axis of rotation is measured as shown in FIG. 2A. The deviation of the axis of the contour of the magnetic field generator 1 from the axes of magnetic fields generated thereby can thus be measured.

As described so far, according to the present invention, axially symmetric electromagnetic fields can be measured readily with high precision and low cost.

What is claimed is:

1. A measuring method for measuring axially symmetric electric field or magnetic field generated by an electric field generator or magnetic field generator which has a rotationally symmetric shape and generates an electric field or magnetic field that is symmetrical to the axis of the rotationally symmetric shape, said measuring method comprising:

adjusting a position of said electric field generator or magnetic field generator placed on a rotator so that the axis of the rotationally symmetric shape of said electric field generator or magnetic field generator coincides with an axis of rotation of said rotator; and measuring an electric field or magnetic field, which is generated by said electric field generator or magnetic field generator, by using an electric field sensor or magnetic field sensor and by changing a rotational position of said rotator until said rotator completes one rotation.

2. A measuring method according to claim 1, wherein measuring an electric field or magnetic field is repeated while a position of a probe of said electric field sensor or magnetic field sensor is changed along a plane that includes said axis of rotation of said rotator.

3. A method for measuring a displacement of an axis of an axially symmetric electric field or magnetic field generated by an electric field generator or magnetic field generator from a mechanical axis of said electric field generator or magnetic field generator which has a rotationally symmetric shape, said method comprising:

measuring an electric field or magnetic field, which is generated by said electric field generator or magnetic field generator placed on a rotator, by using an electric field sensor or magnetic field sensor and by changing a rotational position of said rotator until said rotator completes one rotation; and adjusting a position of said electric field generator or magnetic field generator on said rotator so that an intensity of said electric field or magnetic field does not change when a rotational position of said rotator is changed while a position of a probe of said electric field sensor or magnetic field sensor is fixed; and measuring a displacement of said mechanical axis of said electric field generator or magnetic field generator from said axis of rotation of said rotator.

4. A method according to claim 3, wherein measuring a displacement is carried out by using a contact type displacement measuring instrument so that said contact type displacement measuring instrument is brought into contact with a side of said electric field generator or magnetic field generator, and a change of measuring value of said contact type displacement measuring instrument is detected while said rotator is rotated.

* * * * *